United States Patent [19]

Umbaugh

[11] 3,869,787

[45] Mar. 11, 1975

[54] METHOD FOR PRECISELY ALIGNING CIRCUIT DEVICES COARSELY POSITIONED ON A SUBSTRATE

[75] Inventor: Charles Wayne Umbaugh, Phoenix, Ariz.

[73] Assignee: Honeywell Information Systems Inc., Waltham, Mass.

[22] Filed: Jan. 2, 1973

[21] Appl. No.: 320,233

[52] U.S. Cl. .......... 29/577, 29/464, 29/497, 29/502, 29/590, 29/626

[51] Int. Cl. .......... B01j 17/00

[58] Field of Search .......... 29/577, 464, 497, 502, 29/590, 626, 589; 228/56

[56] References Cited

UNITED STATES PATENTS

| | | | |
|---|---|---|---|
| 3,200,490 | 8/1965 | Clymer | 29/589 UX |
| 3,392,442 | 7/1968 | Napier et al. | 29/502 X |
| 3,429,040 | 2/1969 | Miller | 29/626 |
| 3,457,639 | 7/1969 | Weller | 29/590 X |
| 3,458,925 | 8/1969 | Napier et al. | 29/590 X |
| 3,486,223 | 12/1969 | Butera | 29/497 X |
| 3,585,713 | 6/1971 | Kaneda et al. | 29/590 X |
| 3,641,663 | 2/1972 | Osoegawa et al. | 29/497 X |
| 3,702,500 | 11/1972 | Gorwas et al. | 29/589 X |

*Primary Examiner*—Robert D. Baldwin
*Assistant Examiner*—Ronald J. Shore
*Attorney, Agent, or Firm*—Walter W. Nielsen; Edward W. Hughes; Edward A. Gerlaugh

[57] ABSTRACT

In the fabrication of microcircuit electronic assemblies a method for precisely aligning devices on a substrate. A device-attach area the same size as a circuit device to be aligned is accurately located on the substrate. The circuit device is then placed coarsely positioned on the area, and surface tension of a liquid interposed between the device and the area is utilized to align the device.

11 Claims, 8 Drawing Figures

METHOD FOR PRECISELY ALIGNING CIRCUIT DEVICES COARSELY POSITIONED ON A SUBSTRATE

BACKGROUND OF THE INVENTION

The invention relates to the fabrication and assembly of microminiature electronic apparatus and particularly to a means for precisely positioning circuit elements such as semiconductor integrated circuit devices on a substrate.

Current technology has provided for the attachment of solid-state circuit elements such as semiconductor integrated circuits and other devices directly on substrates such as alumina or beryllia, and the subsequent connection of leads or pads of the devices to interconnecting circuit elements such as conductive runs formed on the surface of the substrate. The general practice heretofore has been to move and position the devices to be attached more or less individually using precision mechanisms, e.g., pick-up and alignment tools of the type utilizing a vacuum. Such operations are generally performed by operators using microscopes in order to assure proper positioning of the devices. Miniaturization of electronic apparatus has increased the difficulty of positioning the devices and interconnecting such apparatus. Moreover, the devices and substrates are smaller, more fragile, and exhibit a considerably greater functional density than in prior art structures. For example, leaded devices may have widths typically less than 100 microns, with the spacings therebetween of the same or smaller dimensions. A semiconductor integrated circuit chip may be, say 500 microns on a side and yet have from 16 to 36 or more external lead connections. Consequently, it is apparent that the alignment of devices on substrates for interconnection with circuit elements on the substrate must be accurate and precise. Subsequent joining of the leads of the circuit elements with the interconnecting elements of the substrate requires that one be aligned with respect to the other with great accuracy. Achievement of the required alignment accuracy has, prior to my invention, relied on the utilization of sophisticated, precision mechanical/optical/electrical systems which are often operator controlled. Such precision transfer and alignment systems are costly, and often limit production due to the single-device processing capability characteristic of the operator controlled equipment.

Surface tension of liquid has been used in the past for face-down or flip-chip bonding of semiconductor devices on interconnecting substrates, however, precise alignment of the device being bonded is required prior to the joining operation in order to align the connecting elements of the device with the interconnecting elements of the substrate. In the latter described process, surface tension is utilized to more precisely align an already precisely aligned device and to hold the device spaced away from the substrate.

Accordingly, it is an object of my invention to provide a means for precisely aligning circuit devices coarsely positioned on a substrate and in so doing to reduce the number of low tolerance operations required for assembling electronic microcircuit apparatus.

SUMMARY OF THE INVENTION

In accordance with one aspect of my invention, a device to be emplaced and aligned face up on a substrate is prepared by depositing a layer of reflowable material on the back surface of the device. An area having planar dimensions virtually equal to the dimensions of the circuit device to be aligned is then accurately defined on a substrate. The area is formed by depositing a layer of material on the substrate, which material is adherent to the substrate material. A layer of reflowable material is then deposited on the substrate area. The reflowable material is either the same as that used on the back surface of the circuit device, or a complement of that material. The device is placed in coarse alignment, face up on the substrate area to which it is to be attached. The preassembled system is then heated to a temperature above the melting point of the reflowable material system being used. The surface tension of the liquid exerts forces which cause the integrated circuit chip to precisely align itself with the substrate area.

In another embodiment, the substrate area is coated with a fluid material, i.e., either a liquid or a fluid capable of being liquified as by the application of heat. The fluid is of a material which is capable of wetting the area, but not capable of wetting the substrate adjacent to the area. Further, the fluid must be capable of wetting the back surface of the circuit element to be aligned, but not capable of wetting the body of the circuit element.

The invention is pointed out with particularity in the appended claims, however, other objects and features will become more apparent and the invention itself will best be understood by referring to the following description and embodiments taken in conjunction with the accompanying drawings.

DESCRIPTION OF THE PREFERRED EMBODIMENT

Figure 1:
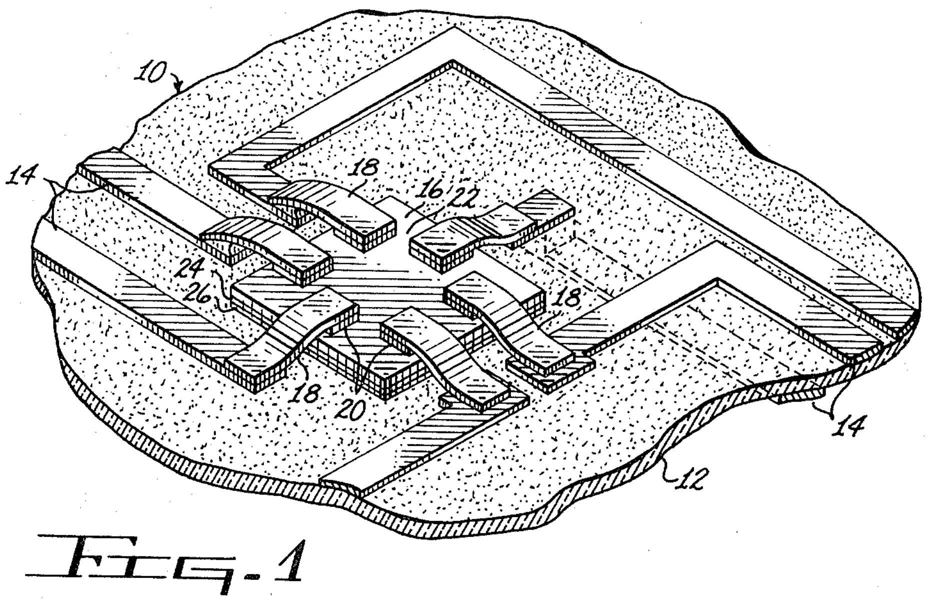
FIG. 1 is an isometric view of an integrated circuit device attached to a substrate.

FIG. 1 shows a microminiature electronic assembly 10 comprising a substrate 12 having thereon a pattern of circuit elements including conductive leads 14. The substrate 12 may be of any material, rigid or flexible, suitable for supporting an array of interconnecting leads 14 and other circuit elements attached thereto. The substrate 12 may be, for exampe, silicon, alumina, beryllia, glass, epoxy-glass, polyimide plastic or the like. An integrated circuit element or chip 16 having cantilevered leads 18 is shown attached to the substrate 12. The leads 18 are each attached to a conductive land or pad 20 formed on an active surface 22 of the chip 16. The pads 20 are in turn connected to integrated circuit devices (not shown) formed on the active surface 22 of the chip 16. The leads 18 thus serve to connect the integrated circuit devices on the chip 16 to the conductive metal leads 14 of the substrate.

The chip-to-substrate attachment medium comprises a layer of reflowable material 24, which may be, for example, tin-lead eutectic alloy or another solder. A buffer layer 26 of mutually compatible adherent material may be deposited on the substrate 12 if the wetting characteristics of the substrate 12 material are incompatible with the reflowable material 24. Similarly, another buffer layer (not shown) may be provided between the chip 16 and the layer of reflowable material 24. The planar dimensions of the layers 24 and 26 are virtually equal to those of the chip 16.

The assembly described with reference to FIG. 1 is purely exemplary and although the substrate 12 may be described, for example, as comprising a ceramic wafer having a conductive pattern of deposited gold film, it is understood that it may as well be an organic dielectric having copper foil circuits. It is further understood that the drawings are not to scale and the dimensions of the various elements shown in the drawings are exaggerated in order to clarify the explanation and therefore the understanding of my invention.

The beam leads 18 of the integrated circuit device may be formed by a process described in my copending application Ser. No. 232,029, filed Mar. 6, 1972, and assigned to the same assignee as the present invention. The process described and claimed herein may also be utilized with circuit devices without beam leads, i.e., having only the conductive lands or pads 20 built up on the active surface 22 of the device 16. After alignment of such devices in accordance with my invention, the pads 20 may be connected to the conductive leads of the substrate by any of the well-known techniques such as fly-wire bonding. The process of my invention may thus be utilized to orient integrated circuit chips or other microminiature circuit elements with or without beam leads in such a manner that the devices are precisely aligned with respect to the substrate, and without employing precision positioning mechanisms.

Figures 2, 3:
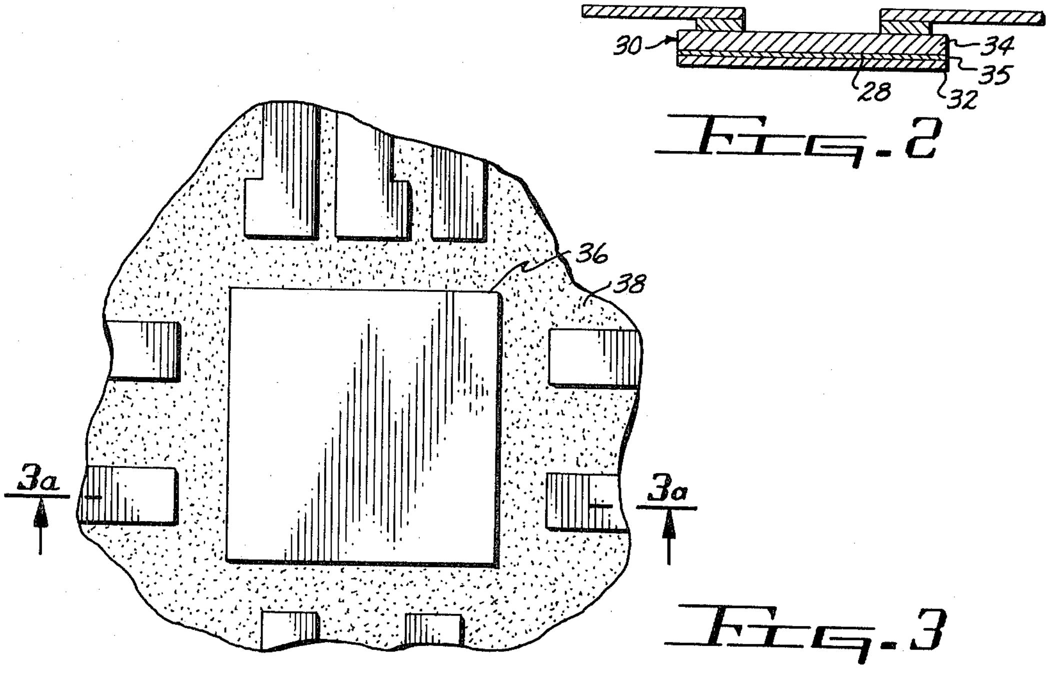
FIG. 2 is a section view of an integrated circuit device.
FIG. 3 is a plan view of a portion of a substrate prior to attachment of the chip.

Referring now to FIG. 2, a back surface 28 of an integrated circuit chip 30 to be bonded to a substrate is prepared by depositing a layer 32 of reflowable material thereon. In the embodiment described wherein the chip 30 comprises integrated circuit devices (not shown) formed in a body of semiconductor material 34 such as silicon, metallurgical compatibility must be established between the silicon surface 28 and the layer 32 by using an appropriate buffer layer 35 such as the chrome-chrome/copper system. The layer 32 may be a solder, for example, lead-tin, gold-tin, or indium-lead alloys or the like. The layers 32, 35 are most conveniently formed or deposited when the chip 30 is still in wafer form.

Figure 3A:
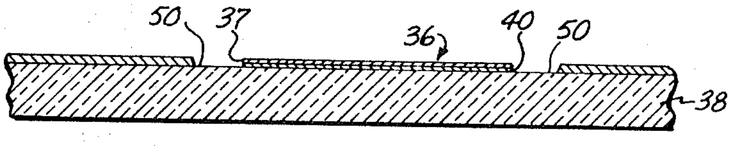
FIG. 3*a* is a section view of the substrate of FIG. 3 taken along lines 3*a*—3*a*.

Referring to FIGS. 3 and 3*a*, a device-attach area or alignment pad 36 is defined on a substrate 38, the area 36 having planar dimensions virtually equal to those of the circuit device to be attached. The dimensions of the alignment pad 36 and the accuracy with which the pad is located is application dependent; in most cases accuracy within $\pm d$ (see FIG. 6*a*) is reasonable. The alignment pad 36 is formed by selectively patterning, as by photolithographic etching, vapor deposition through a mask, screening, etc., a reflowable metal layer 37 which is adherent either to the substrate 38 material or to an adherent layer 40 deposited between the substrate 38 and the reflowable metal layer 37. The layer of reflowable metal 37 may be either the same material as that used on the back surface of the integrated circuit device to be attached (FIG. 2) or a complement of that material. The combined thickness $d$ (see FIG. 6*a*) of the reflowable layers 37 and 32 (FIG. 2) is preferably about 25 microns for most applications, but may vary from as little as 1 to 100 microns or more.

Figure 4:
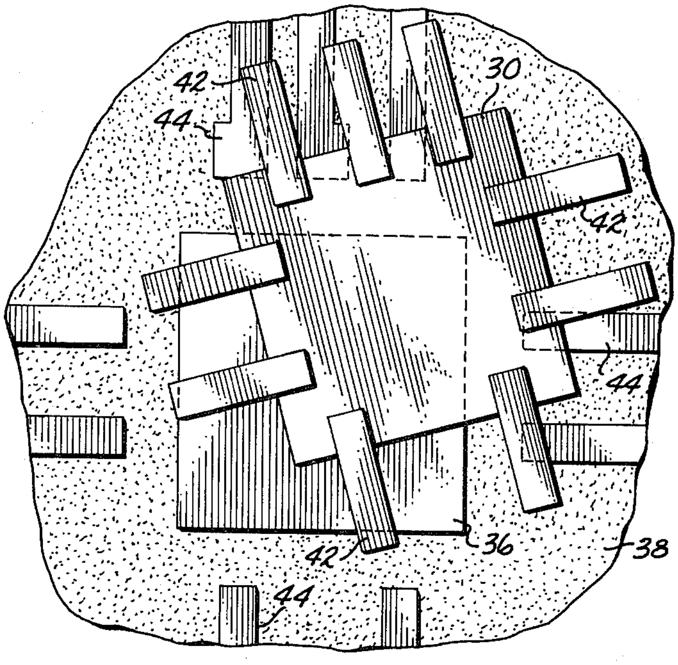
FIG. 4 is a plan view of a coarsely positioned integrated circuit chip on a substrate.

Referring now to FIG. 4, the chip 30 is shown coarsely positioned, face up, on the device-attach area 36 of the substrate 38. Empirical test data derived by coarsely positioning and subsequently aligning and bonding approximately 100 integrated circuit devices varying in size from 1.25 to 3.75 mm showed that best results were achieved when the coarse positioning of the chip and the device-attach area was such that the rotation angle $\phi$, see FIG. 6, was within $\pm 35°$ of the final desired orientation, and the $x$–$y$ positions were within one-third of the chip dimensions along the corresponding axis. Devices used during empirical testing included essentially square integrated circuit chips, both with and without beam leads attached, as well as rectangular devices. The empirically derived coarse alignment parameters noted above are nominal interdependent ranges of values established for general manufacturing use; individual values exceeded the ranges cited without degrading the process. For example, when the rotation angle $\phi$ was minimal, say, 10° or less, $x$–$y$ misalignments as high as 70 to 80 percent of the corresponding chip dimension were successfully corrected. The $x$ and $y$ misalignments are of course similarly interdependent. During empirical testing, a minimal misalignment along one axis allowed correction of substantial misalignment, as much as 85 percent and more, along the other. And with minimal misalignment along both lateral axes, rotational misalignments (for square chips) approaching 45° were repeatedly corrected without gross error (90° misalignment). Coarse positioning, therefore, is defined as the positioning of a circuit element on an alignment pad within limits empirically derived as suitable for a manufacturing environment, and within which limits no gross misalignment, i.e., by 90° or 180°, of the circuit element occurs. During the testing, it was observed that considerable force appeared to be exerted on the misaligned devices.

Figure 5:
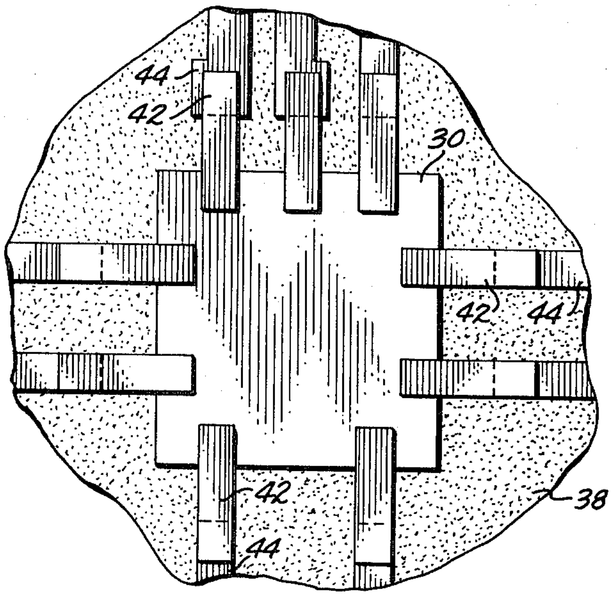
FIG. 5 is a plan view of the integrated circuit chip of FIG. 5 upon completion of the automatic alignment process.

Referring again to FIG. 4, after coarse positioning of the chip 30, heat is applied to the assembly comprising the chip 30 coarsely positioned on the alignment pad 36 of the substrate 38. When sufficiently heated, the reflowabe metal layers liquify and form a single interface layer between the chip 30 and the alignment pad 36. Under the influence of surface tension, the chip 30 is precisely aligned with respect to the substrate 38, as shown in FIG. 5. Beam leads 42 attached to the chip 30 are thus automatically aligned with corresponding leads 44 on the substrate 38.

Situations may arise where bonding of the chip 30 to the substrate 38 is not desired. For example, during testing of an integrated circuit device, it is desirable to temporarily connect the beam leads 42 to the interconnecting circuit runs or leads 44 of the substrate 38, while retaining the option of easily removing of the chip 30 if it is determined to be defective. It is understood that alignment of the chip 30 as shown in FIG. 5 does not serve to join the beam leads 42 to the interconnecting circuitry or leads 44 of the substrate (as shown in FIG. 1); such joining is not a part of this invention. Other techniques not disclosed herein are utilized to join the aligned beam leads 42 to the interconnecting conductors 44 of the substrate. In order to align the chip 30 without permanently attaching it to the substrate, no reflowable metal is deposited either on the circuit device or the device-attach area 36. Instead, see FIG. 3*a*, the layer 40 of adherent material is coated with a layer 36 of fluid material having a high vapor pressure which will not wet the adjacent substrate surface 50. Similarly, see FIG. 2, the back surface 28 of the chip 30 is coated with a buffer layer 35 of material which is wettable by the fluid material, the body 34 of the device being non-wettable by the fluid material. The surface tension and wetting characteristics of volatile substances used for alignment and temporary interconnection of circuit elements are selected such that the alignment function is accomplished without bonding the chip to the substrate. After alignment, any volatile fluid remaining may be driven off by heating. Representative materials that may be used are water-soluble flux, wax, and solder-stopoff.

The following is a derivation of the approximate instantaneous translational and rotational forces and attendant accelerations relating to surface-tension induced alignment of circuit elements with a substrate. The derivation is valid only for initial misalignments wherein no portion of the chip extends beyond the first quadrant of the coordinate system defined in FIG. 6, however, it is evident that the derivation may be extended to include other quadrants.

Figure 6:
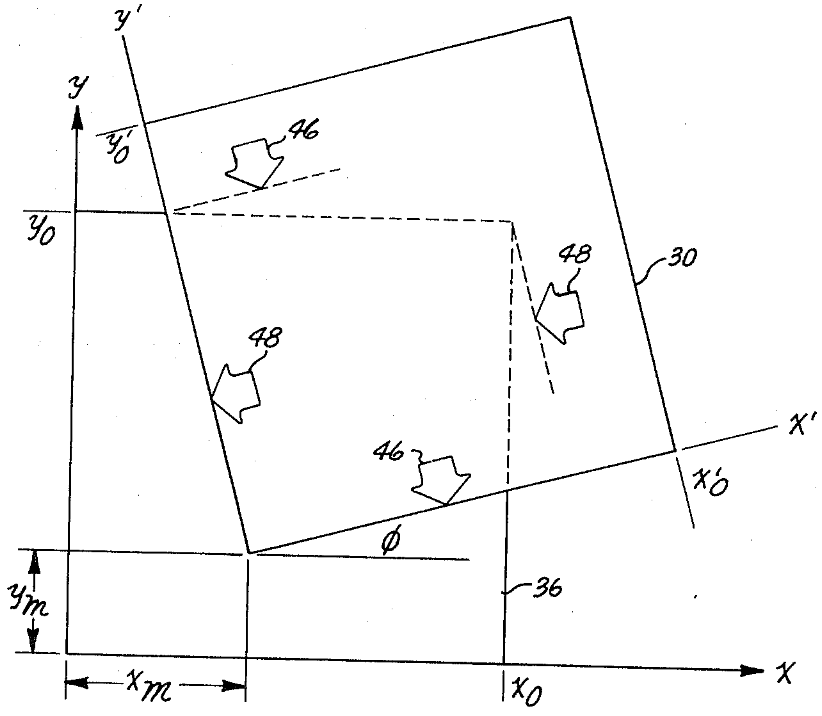
FIGS. 6 and 6*a* are diagrammatic representations of a coarsely misaligned chip and die-attach pad superimposed upon a Cartesian coordinate system.
Figure 6A:
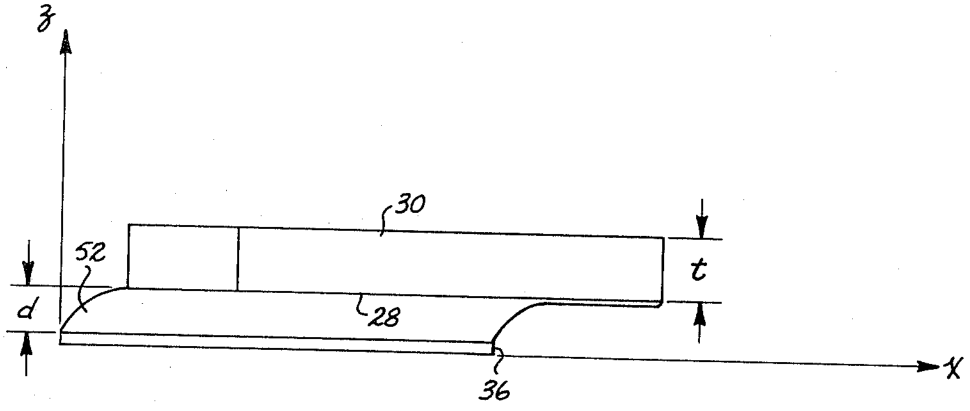

It is understood that the derivation is idealized by the following limitations in order to reduce complexity of the mathematical model, refer to FIGS. 6 and 6*a*: (a) The surface tension is equal to zero across the shared interface between the chip 30 and the alignment pad 36. (b) The interfacing surfaces of the chip 30 and the device-attach area 36 are each wetted by a continuous layer of liquid 52, and therefore exhibit an isotropic surface tension $\sigma$. (c) To maintain problem symmetry for the calculations it is assumed that forces are generated along lines $F_1/2$ and $F_2/2$ represented, respectively, by arrows 46 and 48 in FIG. 6. (d) Forces are assumed to lie in the plane of the interface for misalignments greater than $d$, the total thickness of the liquid. (e) The planar dimensions of the chip 30 and the device-attach area 36 are equal. (f) As the chip 30 becomes aligned with the alignment pad 36, the surface tension forces become normal to the plane of the interface between the chip 30 and the alignment pad 36 and progressively contribute less to further correction. A correction factor is applied to reflect this occurrence.

Translational Force $\overline{F}$ $$\overline{F} = 2\overline{F_1}/2 + 2\overline{F_2}/2 = \overline{F_1} + \overline{F_2}$$

$$\overline{F} = [2\sigma(x_o - x_m)/\cos\phi]\ \underline{\angle \phi + 3\pi\ \angle\ 2} + [2\sigma(y_o - y_m)/\cos\phi]\ \underline{\angle \phi + \pi}$$

Let:

$$x_m = F_x x_o$$
$$y_m = F_y y_o = F_y R x_o$$
$$y_o = R x_o$$

Where $F_x$ and $F_y \leqslant 1$ are fractional misalignments of a chip, respectively, in the $x$ and $y$ directions, and where R is the ratio of the chip side lengths $x'_o$:$y'_o$.

$$\beta = \phi + 3\pi/2$$
$$\gamma = \phi + \pi$$

Then:

$$\overline{F} = (2\sigma x_o/\cos\phi)\ [(1 - F_x)\ \underline{\angle\beta} + R(1 - F_y)\angle\gamma] \quad (1)$$

and:

$$\underline{\angle\beta} = \underline{\angle\phi + 3\pi\ /\ 2} => \cos(\phi + 3\pi/2)\hat{j} + \sin(\phi + 3\pi/2)\hat{j}$$

$$\underline{\angle\gamma} = \underline{\angle\ \phi + \pi} => \cos(\phi + \pi)\hat{j} + \sin(\phi + \pi)\hat{j}$$

Equation (1) is valid for lateral misalignments greater than approximately $d$, see FIG. 6*a*, the thickness of the composite interface layer 52 comprising, e.g., the liquified layers 32, 37 of FIGS. 2, 3*a*. For smaller misalignments the surface tension force is no longer in the plane of the back surface 28 of the chip 30. A correction factor is required then for small misalignments, which factor yields zero translational forces for zero misalignment.

The correctional force equation has the form:

$$\overline{F}_n' = \overline{F}_n[1 - e^{-(k_n/T_c)}] \text{ where } T_c = d/2 \quad (2)$$

Regarding Forces $\overline{F_1}$ and $\overline{F_2}$:

$$k_1 = y_m + [(x_o - x_m)/2]\tan\phi = Rx_oF_y + [(x_o - F_x x_o)/2]\tan\phi \quad (3a)$$

$$k_2 = x_m - [(y_o - y_m)/2]\tan\phi = x_oF_x - [(Rx_o - Rx_oF_y)/2]\tan\phi \quad (3b)$$

Applying these correction factors to equation (1):

$$\overline{F} = 2\sigma x_o/\cos\phi[(1 - F_x)\ (1 - e^{-2k_1/d})\ \angle\beta + R(1 - F_y)\ (1 - e^{-2k_2/d})\ \underline{\angle\gamma}] \quad (4)$$

Translational Acceleration $\overline{A}$

Since the mass of a chip $M = \rho_{si}Rx_o^2t$, and translational acceleration $\overline{A} = \overline{F}/M$, then:

$$\overline{A} = \text{Equation (4)}/M \text{ or}$$

$$\overline{A} = (2\sigma/\rho_{si}Rx_o\, t \cos\phi)\ [(1 - F_x)\ (1 - e^{-2k_1/d})\ \angle\beta + R(1 - F_y)\ (1 - e^{-2k_2/d})\ \underline{\angle\gamma}] \quad (5)$$

Rotational Moment of Inertia I $$I = \int_{-y_o/2}^{y_o/2} \int_{-x_o/2}^{x_o/2} (x^2 + y^2)\rho_{si}t\, dx\, dy,$$

where $\rho_{si}$ is the density of silicon.

$$I = (\rho_{si}t/3)\ (x^3y + y^3x) \Big|_{-x_o/2}^{x_o/2} \Big|_{-y_o/2}^{y_o/2}$$

$$I = (4\rho_{si}t/3)\ [(x_o/2)^3\ y_o/2 + (y_o/2)^3\ x_o/2]$$
$$I = \rho_{si}t/12(x_o^3\ y_o + y_o^3\ x_o)$$
$$I = (\rho_{si}tx_o^4/12)\ (R + R^3) = (Mx_o^2/12)\ (1 + R^2) \quad (6)$$

Torque $\overline{T}$ $$\overline{T} = I\overline{\alpha}$$

$$\overline{T} = \{[(x'_o/2) - (x_o - x_m)/2 \cos\phi]\, |\overline{F_1}| - [(y'_o)/2 - (y_o - y_m)/2 \cos\phi]\, |F_2|\}\, k,$$

$$x'_o = x_o,\ y'_o = y_o$$

Substituting new variables:

$$\overline{T} = \{[(x_o/2) - (x_o - F_x x_o)/2 \cos\phi]\, |F_1| - [(Rx_o/2) - (Rx_o - F_yRx_o)/2 \cos\phi]\, |F_2|\}\hat{k}$$

$$\overline{T} = \{x_o|F_1|[(1/2) - (1 - F_x)/2 \cos\phi] - Rx_o|F_2|[(1/2) - (1 - F_y)/2 \cos\phi]\}\hat{k} \quad (7)$$

where:

$$\overline{F_1} = (2\sigma x_o/\cos\phi)\,(1 - F_x)\,(1 - e^{-2k_{1/r}})/\angle\beta$$

$$\overline{F_2} = (2\sigma x_o/\cos\phi)\,R(1 - F_y)\,(1 - e^{-2k_2/r})\angle r$$

Angular Acceleration $\alpha$ $$\overline{\alpha} = \overline{T}/I = \text{Equation (7)/Equation (6)} \qquad (8)$$

Equations (4), (5), (7) and (8) provide a set which allows the calculation of the forces involved in surface tension induced self alignment during a chip attachment. Typical ranges of parameters are listed in Table I. Table II lists a specific set of parameters, and Table III shows a set of calculations for the parameters of Table II, using equations (4), (5), (7) and (8). It will be seen from Table III that the instantaneous angular response may appear incongruous with the desired results, however, the rotational perturbations of a chip in dynamic correction are not apparent in the simplified static model described herein. The static values at and near one such condition of apparent rotational equilibrium (*Table III) are shown in Table IV. The rotational equilibrium condition, which exists even with a misalignment of 15°, is shown to be extremely fragile. The results achieved with the mathematical model confirm the observations noted during empirical testing.

TABLE I

| | |
|---|---|
| $\rho_{si}$ | = 2.3 gm/cc |
| $\sigma$ | = 400 dynes/cm |
| d | = 0.002 – 0.008 cm |
| $x_o$ | = 0.005 – 0.50 cm |
| R | = 0.8 – 1.8 |
| t | = 0.02 – 0.05 cm |
| $F_x$ | = 0.001 – 0.3 |
| $F_y$ | = 0.001 – 0.3 |
| $\phi$ | = 5 – 35° |

TABLE II

| | |
|---|---|
| $\rho_{si}$ | = 2.3 gm/cc |
| $\sigma$ | = 400 dynes/cm |
| d | = 0.005 cm |
| $x_o$ | = 0.25 cm |
| R | = 1 |
| t | = 0.025 cm |
| M | = 0.00359 gm |
| I | = 3.74 × $10^{-5}$gm/cm² |

TABLE III

| $F_x$ | $F_y$ | $\phi$ degrees | $\overline{F}$ dynes | $\overline{A}$ cm/sec² | $\overline{A}$ Direction degrees | T dynes/cm | $\alpha$ rad/sec² |
|---|---|---|---|---|---|---|---|
| 0.1 | 0.1 | 0 | 226.4 | 70,859 | 225 | 0 | 0 |
| 0.2 | 0.2 | 0 | 177.1 | 62,988 | 225 | 0 | 0 |
| 0.01 | 0.01 | 0 | 26.90 | 49,273 | 225 | 0 | 0 |
| 0.001 | 0.001 | 0 | 205.0 | 7,485.2 | 225 | 0 | 0 |
| * 0.3 | 0.3 | 15 | 205.0 | 57,057 | 240 | 0 | 0 |
| 0.5 | 0.3 | 15 | 178.2 | 49,580 | 230 | 1.25 | 192K |
| 0.5 | 0.3 | 30 | 198.7 | 55,292 | 245 | 2.22 | 340K |
| 0.5 | 0.5 | 15 | 146.5 | 40,755 | 240 | 0.00 | 0.09 |
| 0.5 | 0.5 | 30 | 163.3 | 45,451 | 255 | 0.00 | 0.09 |
| 0.5 | 0.7 | 15 | 120.8 | 33,606 | 254 | 0.89 | 136K |
| 0.5 | 0.7 | 30 | 134.7 | 37,478 | 269 | 0.44 | 675K |
| 0.6 | 0.5 | 30 | 148.1 | 41,157 | 248 | 0.11 | 173K |
| 0.7 | 0.5 | 30 | 134.7 | 37,478 | 241 | −0.44 | −675K |
| 0.8 | 0.5 | 35 | 131.5 | 36,588 | 237 | −1.33 | −2041K |
| 0.9 | 0.5 | 30 | 117.8 | 32,767 | 221 | −3.55 | −5432K |

TABLE IV

| $F_x$ | $F_y$ | $\phi$ degrees | $\overline{F}$ dynes | $\overline{A}$ cm/sec² | $\overline{A}$ Direction degrees | T dynes/cm | $\alpha$ rad/sec² |
|---|---|---|---|---|---|---|---|
| 0.27 | 0.3 | 15 | 209.1 | 58,292 | 241.1 | −0.37 | −571K |
| 0.29 | 0.3 | 15 | 206.5 | 57,466 | 240.3 | −0.12 | −182K |
| 0.30 | 0.3 | 15 | 205.0 | 57,057 | 239.9 | 0 | 0 |
| 0.31 | 0.3 | 15 | 203.6 | 56,651 | 239.5 | 0.11 | 174K |
| 0.32 | 0.3 | 15 | 202.1 | 56,248 | 239.1 | 0.22 | 340K |

While the principles of my invention have now been made clear in the foregoing description, it will be immediately obvious to those skilled in the art that many modifications of structure, arrangement, proportions, the elements, material and components may be used in the practice of the invention which are particularly adapted for specific environments without departing from those principles. The appended claims are intended to cover and embrace any such modifications within the limits only of the true spirit and scope of my invention.

What is claimed is:

1. In the fabrication of microminiature electronic apparatus, a method for precisely aligning semiconductor integrated circuit chips on a substrate, comprising the steps of:

depositing on an area of the substrate a layer of fluid material, the area having planar dimensions essentially equal to those of the entire back surface of a chip, the fluid material capable of wetting the back surface of the chip but not capable of wetting the body of the chip;

placing the back surface of the chip coarsely positioned on the deposited layer of fluid material, thereby allowing surface tension of the fluid material to precisely align the chip on the substrate.

2. In the fabrication of microminiature electronic apparatus, a method for precisely aligning semiconductor integrated circuit chips on a substrate, comprising the steps of:

depositing a first layer of reflowable material on substantially the entire back surface of a chip;

depositing on an area of the substrate another layer of reflowable material, the area having planar dimensions essentially equal to those of the entire back surface of the chip;

placing the chip face up and coarsely positioned on the deposited other layer of reflowable material;

heating the layers of reflowable material until the layers become liquid and together form an interface layer between the chip and the substrate area; and cooling the interface layer after the chip aligns with the substrate area under influence of the surface tension of the liquified reflowable material.

3. The process as claimed in claim 2, wherein the interface layer formed during the heating step comprises a metal system which, after completion of the cooling step, permanently attaches the aligned chip to the substrate.

4. The process as claimed in claim 2, wherein the first deposited layer of reflowable material comprises an essentially volatile substance.

5. The process as claimed in claim 4, wherein the cooling step is delayed until the first deposited layer evaporates.

6. In the fabrication of microminiature electronic apparatus, a method for precisely aligning circuit elements on a substrate, comprising the steps of:

forming a first circuit element on a surface of the substrate;

depositing a first layer of solder on substantially the entire back surface of a second circuit element, the second circuit element having an electrical conductor extending in cantilevered fashion from an opposite surface thereof;

depositing on an area of the surface of the substrate adjacent the first circuit element another layer of solder, the planar dimensions of the other layer essentially equal to those of the entire back surface of the second circuit element;

placing the second circuit element coarsely positioned on the other layer of solder;

heating the assembly until the layers of solder melt and together form an interface layer between the second circuit element and the substrate area; and cooling the interface layer of solder after the second circuit element aligns with the substrate area under influence of the surface tension of the molten solder, thereby aligning the first circuit element and the electrical conductor.

7. In the fabrication of microminiature electronic apparatus, a method for precisely aligning semiconductor integrated circuit chips on a substrate, comprising the steps of:

forming a circuit element on a surface of the substrate;

defining on the substrate an area having planar dimensions essentially equal to those of the entire back surface of a chip the area precisely positioned with respect to said circuit element;

depositing a layer of fluid material on the area; and placing the back surface of the chip coarsely positioned on the deposited layer of fluid material, the back surface of the chip wettable by the fluid material, the body of the chip non-wettable by the fluid material, thereby allowing surface tension of the fluid to precisely align the chip and circuit element.

8. The process as claimed in claim 1, wherein the substrate area and the back surface of the chip are of rectangular shape.

9. The process as claimed in claim 2, wherein the substrate area and the back surface of the chip are of rectangular shape.

10. The process as claimed in claim 6, wherein the substrate area and the back surface of the second circuit element are of rectangular shape.

11. The process as claimed in claim 7, wherein the substrate area and the back surface of the chip are of rectangular shape.

* * * * *